United States Patent
Doller et al.

(10) Patent No.: US 10,981,777 B2
(45) Date of Patent: Apr. 20, 2021

(54) MEMS TRANSDUCER SYSTEM FOR PRESSURE AND ACOUSTIC SENSING

(71) Applicant: Robert Bosch GmbH, Stuttgart (DE)

(72) Inventors: Andrew Doller, Sharpsburg, PA (US); Gokhan Hatipoglu, Pittsburgh, PA (US); Yujie Zhang, Sunnyvale, CA (US); Bernhard Gehl, Wannweil (DE); Daniel Christoph Meisel, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 78 days.

(21) Appl. No.: 16/464,200

(22) PCT Filed: Nov. 27, 2017

(86) PCT No.: PCT/EP2017/080461
§ 371 (c)(1),
(2) Date: May 24, 2019

(87) PCT Pub. No.: WO2018/096130
PCT Pub. Date: May 31, 2018

(65) Prior Publication Data
US 2019/0389721 A1    Dec. 26, 2019

Related U.S. Application Data

(60) Provisional application No. 62/426,885, filed on Nov. 28, 2016.

(51) Int. Cl.
*B81B 3/00*    (2006.01)
(52) U.S. Cl.
CPC ............ *B81B 3/0021* (2013.01); *B81B 3/007* (2013.01); *B81B 3/0086* (2013.01);
(Continued)

(58) Field of Classification Search
CPC .............................................. B81B 2201/0264
See application file for complete search history.

(56) References Cited

U.S. PATENT DOCUMENTS

| | | | | |
|---|---|---|---|---|
| 2010/0330722 | A1* | 12/2010 | Hsieh | B81C 1/00246 438/53 |
| 2015/0001647 | A1* | 1/2015 | Dehe | B81B 3/0021 257/416 |
| 2015/0289046 | A1* | 10/2015 | Dehe | H04R 1/08 381/111 |

FOREIGN PATENT DOCUMENTS

JP        H06300650 A    10/1994

OTHER PUBLICATIONS

International Search Report corresponding to PCT Application No. PCT/EP2017/080461 dated Aug. 2, 2018 (3 pages).
(Continued)

*Primary Examiner* — Steven B Gauthier
*Assistant Examiner* — Christopher A Culbert
(74) *Attorney, Agent, or Firm* — Maginot, Moore & Beck LLP

(57) ABSTRACT

A MEMS transducer system includes a MEMS transducer device for sensing at least one of pressure signal or acoustic signal. The MEMS transducer device includes first and second diaphragms. Formed between the diaphragms are a spacer, plate capacitor elements, and electrode elements. The plate capacitor elements are coupled to the diaphragms via the spacer. An optional member may be disposed within the spacer. The distal ends of the electrode elements are coupled to a structure such as insulator element. An optional oxides may be formed within the plate capacitor elements. Pressure sensing electrode formed between the diaphragms may be coupled to the insulator element.

11 Claims, 14 Drawing Sheets

(52) U.S. Cl.
CPC .... *B81B 3/0089* (2013.01); *B81B 2201/0257* (2013.01); *B81B 2201/0264* (2013.01); *B81B 2203/0127* (2013.01); *B81B 2203/04* (2013.01)

(56) References Cited

OTHER PUBLICATIONS

Bay J et al: "Design Of A Silicon Microphone With Differential Read-out Of A Sealed Double Parallel-plate Capacitor", 19950625, 19950625-19950629, vol. 2, Jun. 25, 1995 (Jun. 25, 1995), pp. 700-703, XP010305041.

\* cited by examiner

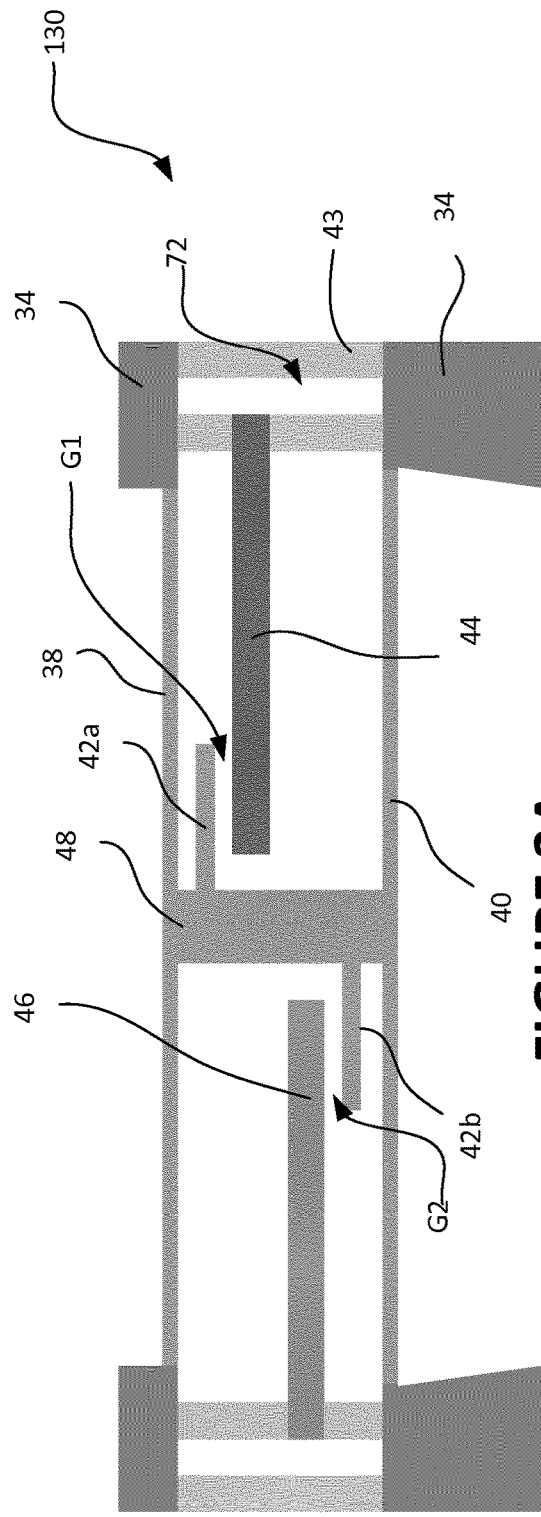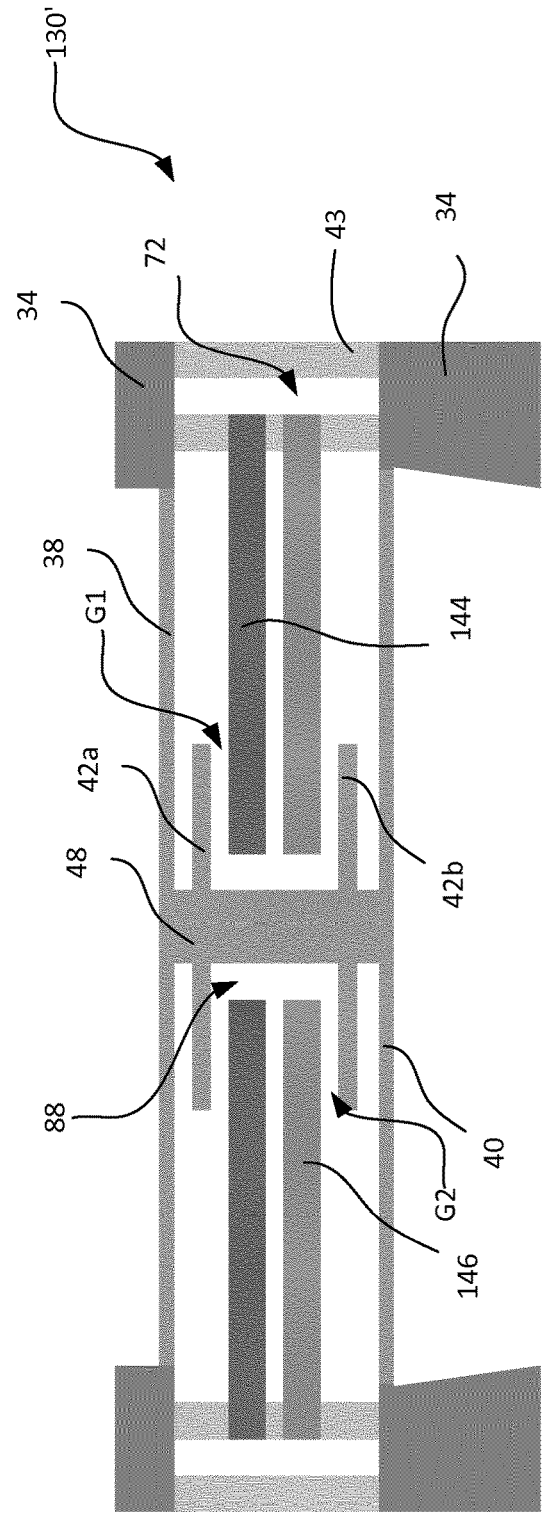
FIGURE 3A
FIGURE 3B

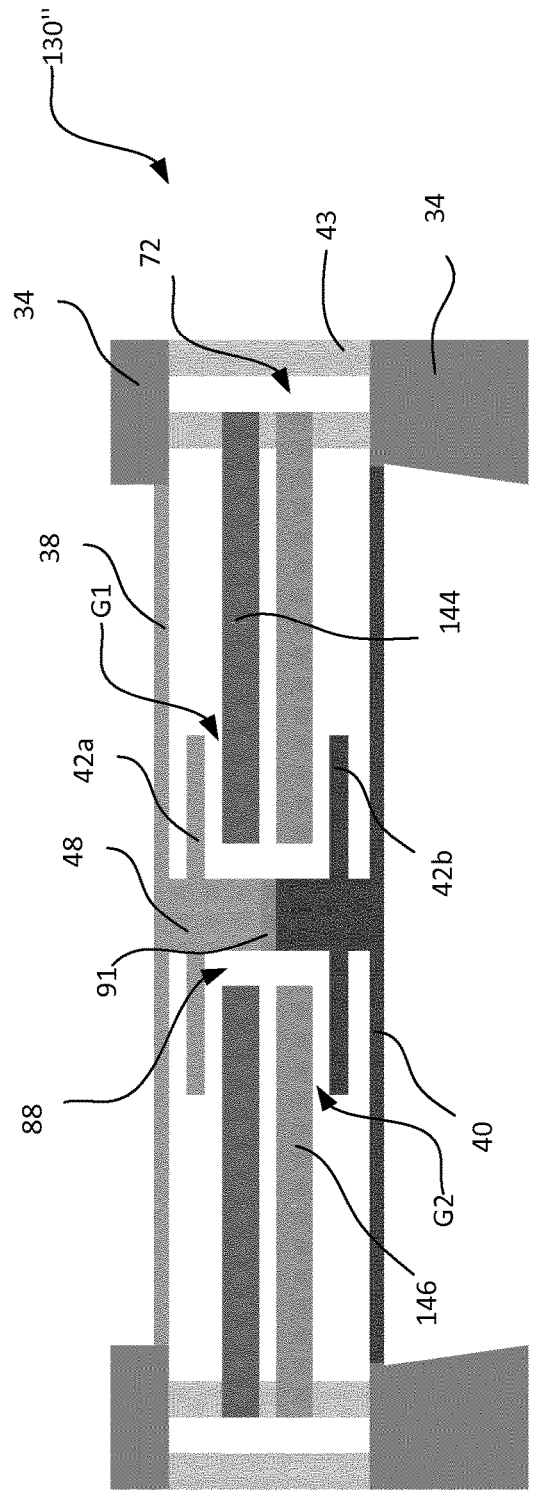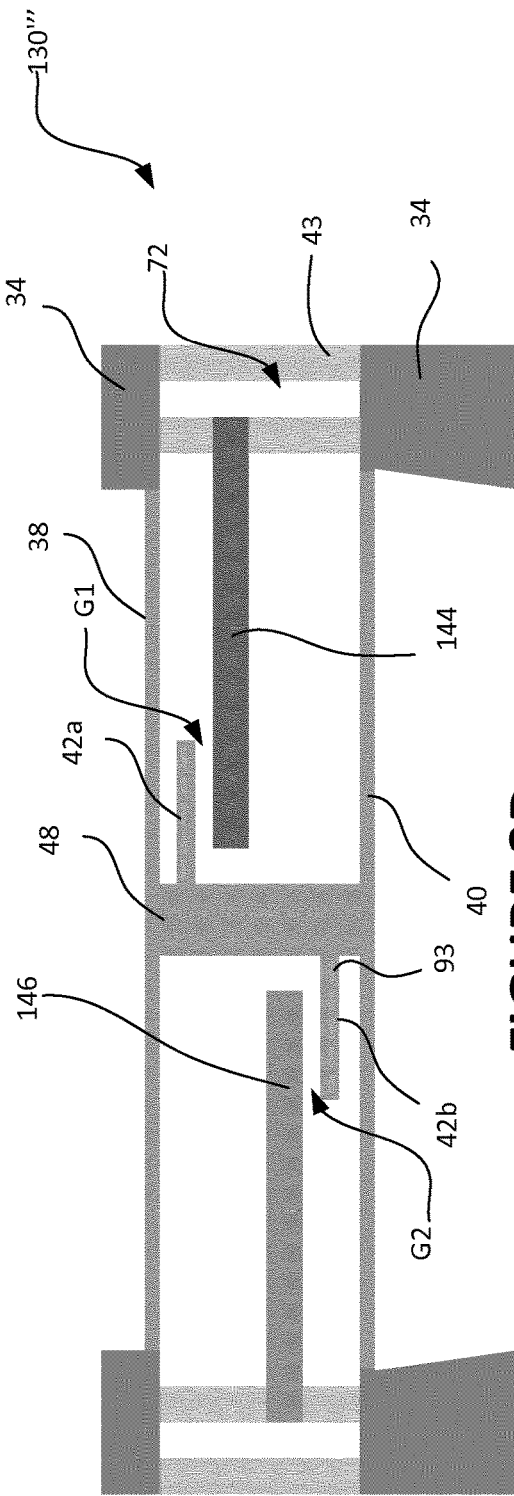

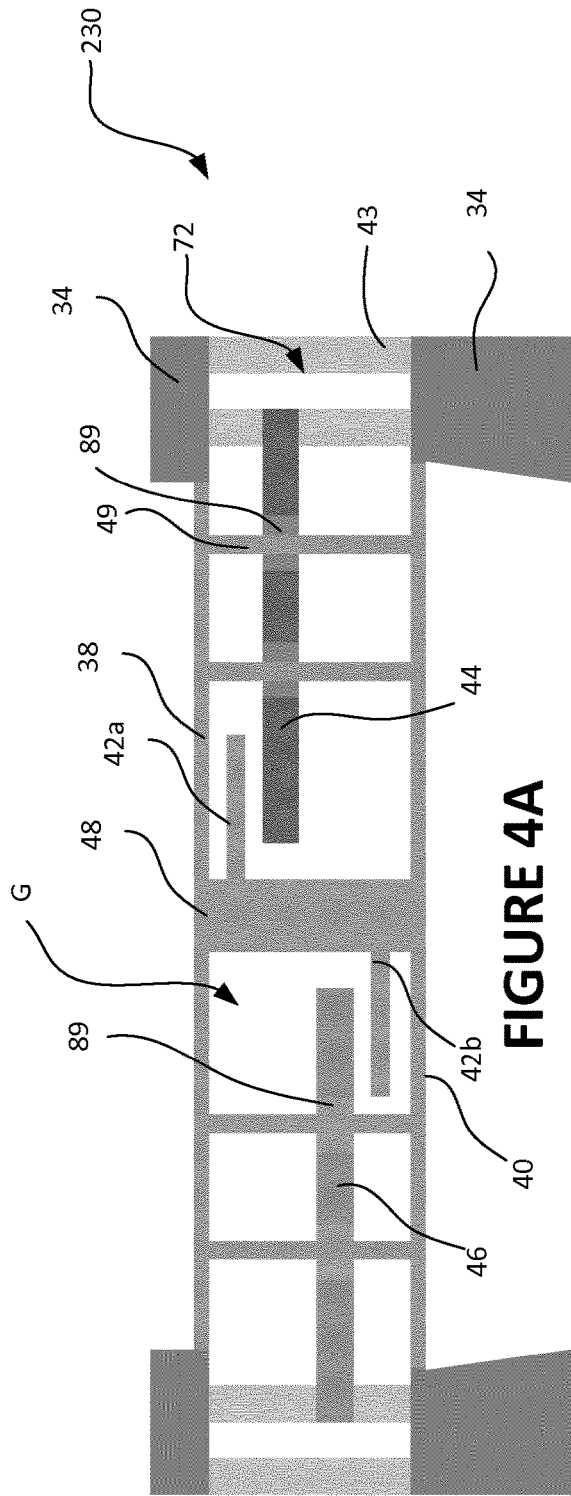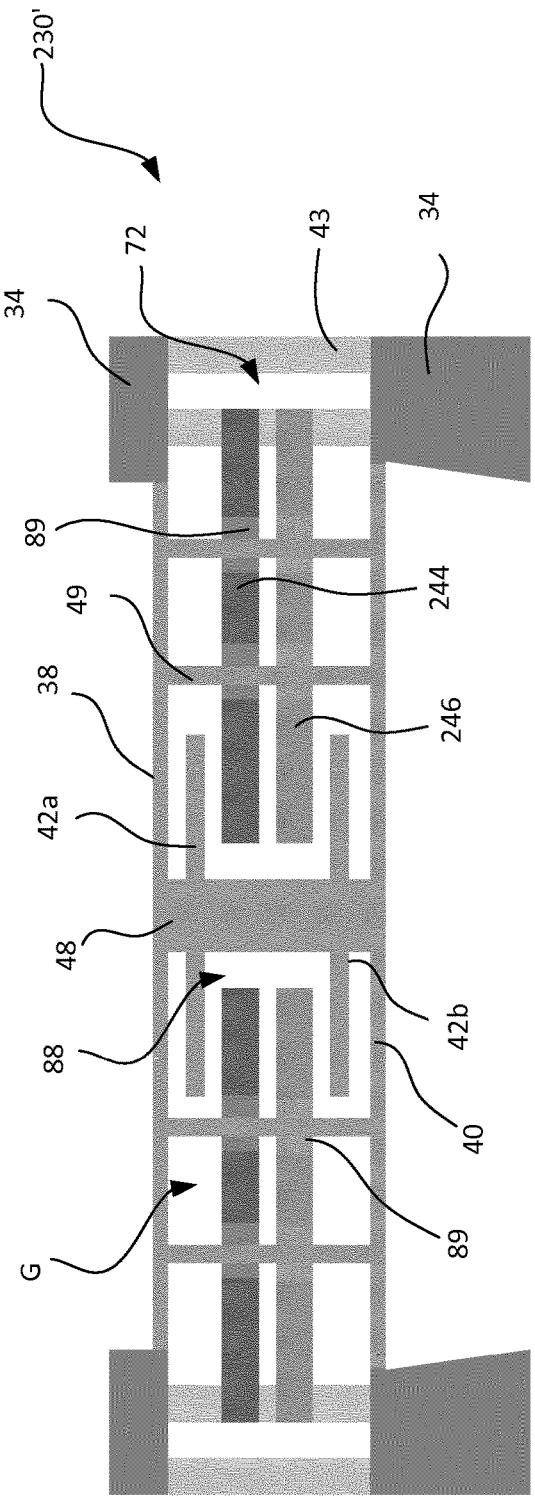

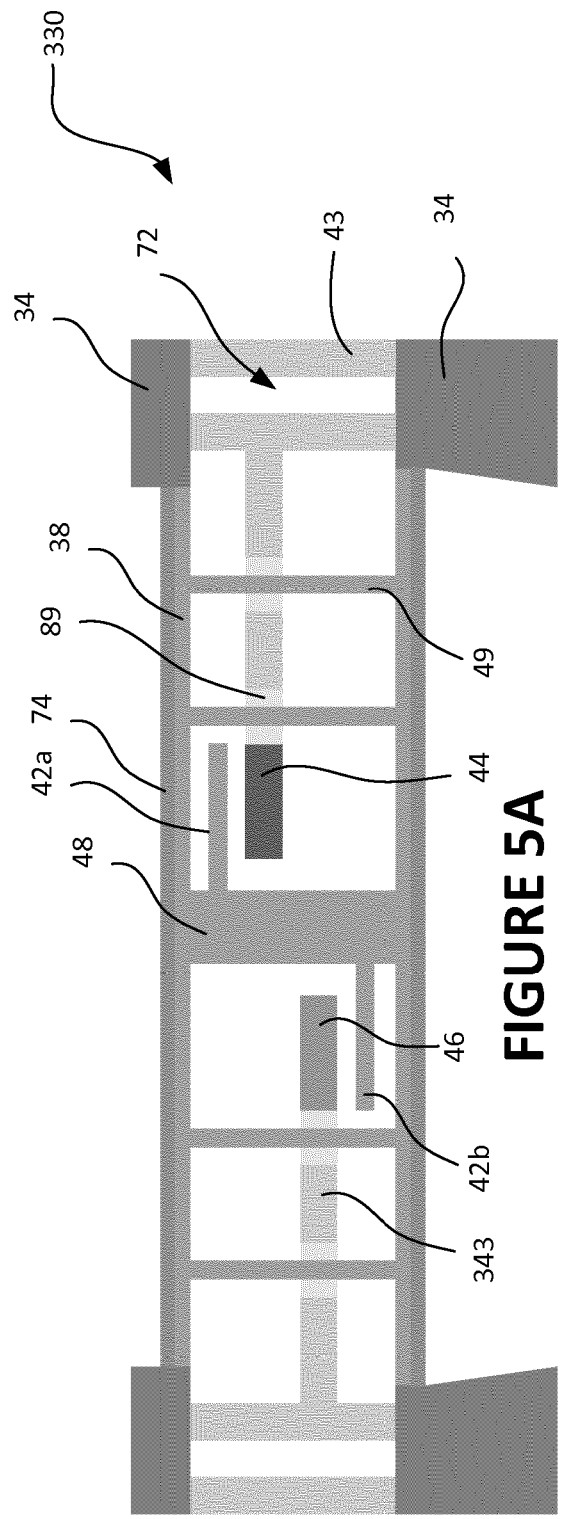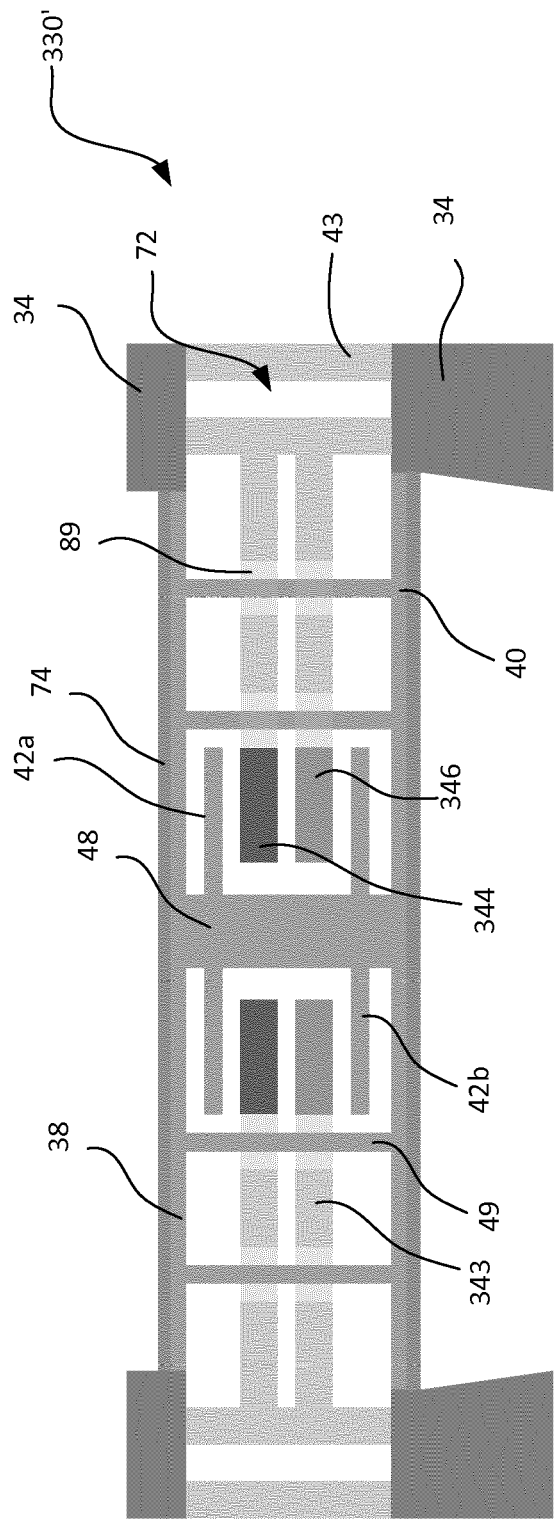
FIGURE 5A
FIGURE 5B

MEMS TRANSDUCER SYSTEM FOR PRESSURE AND ACOUSTIC SENSING

FIELD

This disclosure relates generally to Microelectromechanical System (MEMS) devices and, more particularly, to MEMS transducer system for pressure and acoustic sensing.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure related to MEMS transducer system comprises a first diaphragm and a second diaphragm spaced from the first diaphragm, defines a gap. The MEMS transducer system further comprises a pressure sensing electrode formed within the gap and a spacer having a height, the spacer coupled the first diaphragm to the second diaphragm wherein the pressure sensing electrode is located adjacent to at least one of the first or the second diaphragm. A through hole is formed within the spacer. The MEMS sensing transducer system further comprises top and bottom substrates, and a wall structure coupled the top substrate to the bottom substrate, wherein the pressure sensing electrode is located adjacent to at least one of the first or the second diaphragm being coupled to the wall structure. One or more posts formed within the gap and coupled the first diaphragm to the second diaphragm. Each of the first and second diaphragm comprising an outer surface, a barrier is applied to the outer surfaces of the first and second diaphragms. A plate electrode is formed within the gap, the plate electrode comprises a first end coupled to the spacer. At least one electrode structure formed between the pressure sensing electrode and the plate electrode. The electrode structure comprises one or more openings for receiving the posts.

According to another aspect of the disclosure, a transducer system for pressure and acoustic sensing comprises a substrate, a diaphragm assembly disposed on the substrate, the diaphragm assembly having a first diaphragm, a second diaphragm, and a gap formed therebetween, a wall structure enclosed the gap, and a pressure sensing electrode formed within the gap, wherein the pressure sensing electrode is located adjacent to the first and the second diaphragms. The pressure sensing electrode being coupled to the wall structure. The transducer system further comprises one or more posts formed within the gap, the one or more posts coupled the first diaphragm to the second diaphragm. At least one through hole is formed within at least one of the posts. Located in opposite direction to the pressure sensing electrode is a plate capacitor, the plate capacitor is coupled to at least one of the post. A barrier is formed on the diaphragm assembly.

BRIEF DESCRIPTION OF THE DRAWINGS

These and other features, aspects, and advantages of this disclosure will become better understood when the following detailed description of certain exemplary embodiments is read with reference to the accompanying drawings in which like characters represent like arts throughout the drawings, wherein:

FIG. 3A is a cross-sectional view of a MEMS transducer device in accordance with a described embodiment of the disclosure;

FIG. 3B is a cross-sectional view of a MEMS transducer device in accordance with another exemplary embodiment of the disclosure;

FIG. 3C is a cross-sectional view of a MEMS transducer device in accordance with another exemplary embodiment of the disclosure;

FIG. 3D is a cross-sectional view of a MEMS transducer device in accordance with another exemplary embodiment of the disclosure;

FIG. 4A is a cross-sectional view of a MEMS transducer device in accordance with another exemplary embodiment of the disclosure;

FIG. 4B is a cross-sectional view of a MEMS transducer device in accordance with another exemplary embodiment of the disclosure;

FIG. 5A is a cross-sectional view of a MEMS transducer device in accordance with another exemplary embodiment of the disclosure;

FIG. 5B is a cross-sectional view of a MEMS transducer device in accordance with another exemplary embodiment of the disclosure;

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

The disclosure is a MEMS transducer system for a client machine. Within the client machine are several other electronic components, such as sensor devices, speakers, graphical processor units, computer processor units, host systems, MEMS microphones, and any suitable computer implemented devices either directly or indirectly coupled to the microphone system. The client machine may be a personal computer or desktop computer, a laptop, a cellular or smart phone, a tablet, a personal digital assistant (PDA), a gaming console, an audio device, a video device, an entertainment device such as a television, a vehicle infotainment, a wearable device, an entertainment or infotainment remote control, a thin client system, a thick client system, or the like. Other suitable client machines regardless of size, mobility, or configuration may be suggested to include any number of MEMS transducer system.

The MEMS transducer system includes a package housing or an enclosure for housing any number of sensor devices/dies, internal components, or combination thereof. The sensor devices/dies may be such as MEMS transducers, speakers, receivers, microphones, pressure sensors, thermal sensors, optical sensors, imaging sensors, chemical sensors, gyroscopes, inertial sensors, humidity sensors, accelerometers, gas sensors, environmental sensors, motion sensors, navigation sensors, vital sensors, tunnel magnetoresistive (TMR) sensors, proximity sensors, bolometers, or combination thereof. The microphones may be electret microphones, capacitive microphones, graphene microphones, piezoelectric microphones, silicon microphones, optical microphones, or any suitable acoustic microphones.

Figure 1:
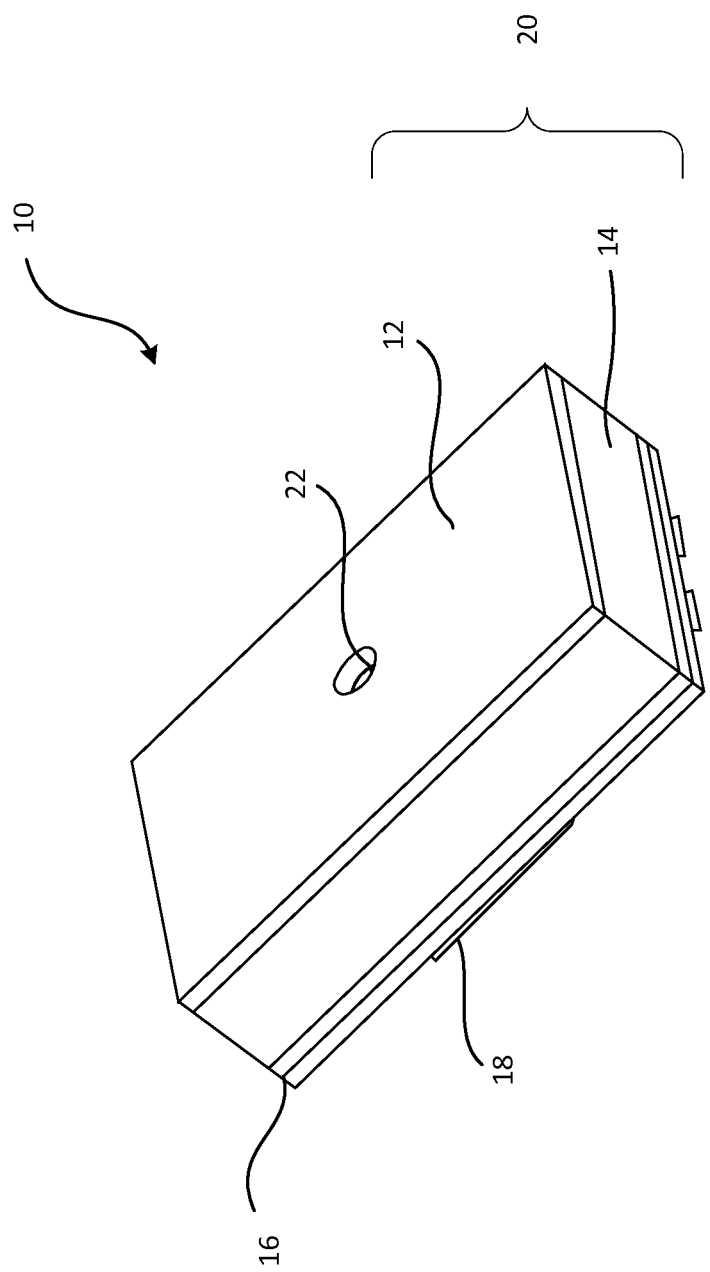
FIG. 1 is a perspective view of a MEMS transducer system in a package in accordance with a described embodiments of a disclosure.

FIG. 1 is a perspective view of a MEMS transducer system 10 according to an embodiment of the disclosure. The MEMS transducer system 10 includes a package housing 20 having a lid 12, a spacer 14, and a substrate 16 attached to the spacer 14 by any suitable methods of attachment. More than one sensor device/die may be mounted within the MEMS transducer system 10. The sensor devices/dies may be MEMS transducers, speakers, receivers, microphones, pressure sensors, thermal sensors, optical sensors, imaging sensors, chemical sensors, gyroscopes, humidity sensors, inertial sensors, vital sensors, TMR sensors, accelerometers, gas sensors, environmental sensors, motion sensors, navigation sensors, proximity sensors, bolometers, or combination thereof. Optional components such as ASICs, integrated circuits, processors, controllers, energy storage devices, actuators, sensor circuits or any suitable circuitry may be mounted within the microphone system 10. Depending on the application, any number of opening 22 such as a port or a passageway for receiving attributes from an environment may be formed on any location of the package housing 20 by etching, piercing, drilling, punching, or any suitable methods. For example, the opening 22 may be formed on the lid 12, the substrate 16, or the spacer 14. In some embodiments, the opening 22 may be formed on multiple locations of the package housing 20. The attributes may be acoustic signal, pressure signal, optical signal, gas signal, and any suitable signal. An optional barrier may be formed within the opening 22. The barrier is configured and functioned as a filter to remove debris, contamination, particles, vapor, fluid, or the like. In some embodiments, the barrier may formed on the outer surface of the housing 20 to cover the opening 22 so that debris, contamination, particles, or the like cannot penetrate into the housing. In yet another embodiments, the barrier may be formed below the opening 22 in which a portion of the barrier is attached to the inner surface of the housing 20 for filtering or removing debris, contamination, particles, or the like. In yet embodiments, the barrier may be fabricated directly onto the movable member such as a diaphragm. In yet another embodiment, the barrier is formed as a layered film or a layered material and may either be integrated into the housing 20 during fabrication, or disposed on the outer or inner surface of the housing 20. Although one barrier is described, multiple layers of barrier or any suitable number of barrier may be implemented on the MEMS package, depending on the application. The barrier not only functions as the particle removal while exposed to the environment via the opening 22, the barrier can also serve other purposes such as a shock absorber, or a vibration damper, or combination thereof. Although the MEMS transducer system 10 as depicted comprises a multi-structure package housing 20, various aspects and configurations either in a single structure package housing, a two piece structure package housing, or multi-structure package housing may be used to encapsulate at least one internal component. As an example, the lid 12 and the spacer 14 may be formed as a single structure, defines a cover or a cap. One or more bonding pads 18 may be formed on the substrate 18, the lid 12, the spacer 14, or multiple locations of the package housing 20 by any suitable method. Once bonding pads 18 are introduced, the MEMS transducer system 10 can be easily mounted to an external printed circuit board or another support member of the client machine. In some embodiments, the package housing further includes an interposer coupled the cover 12 to either the spacer 14 or the substrate 16.

Figure 2A:
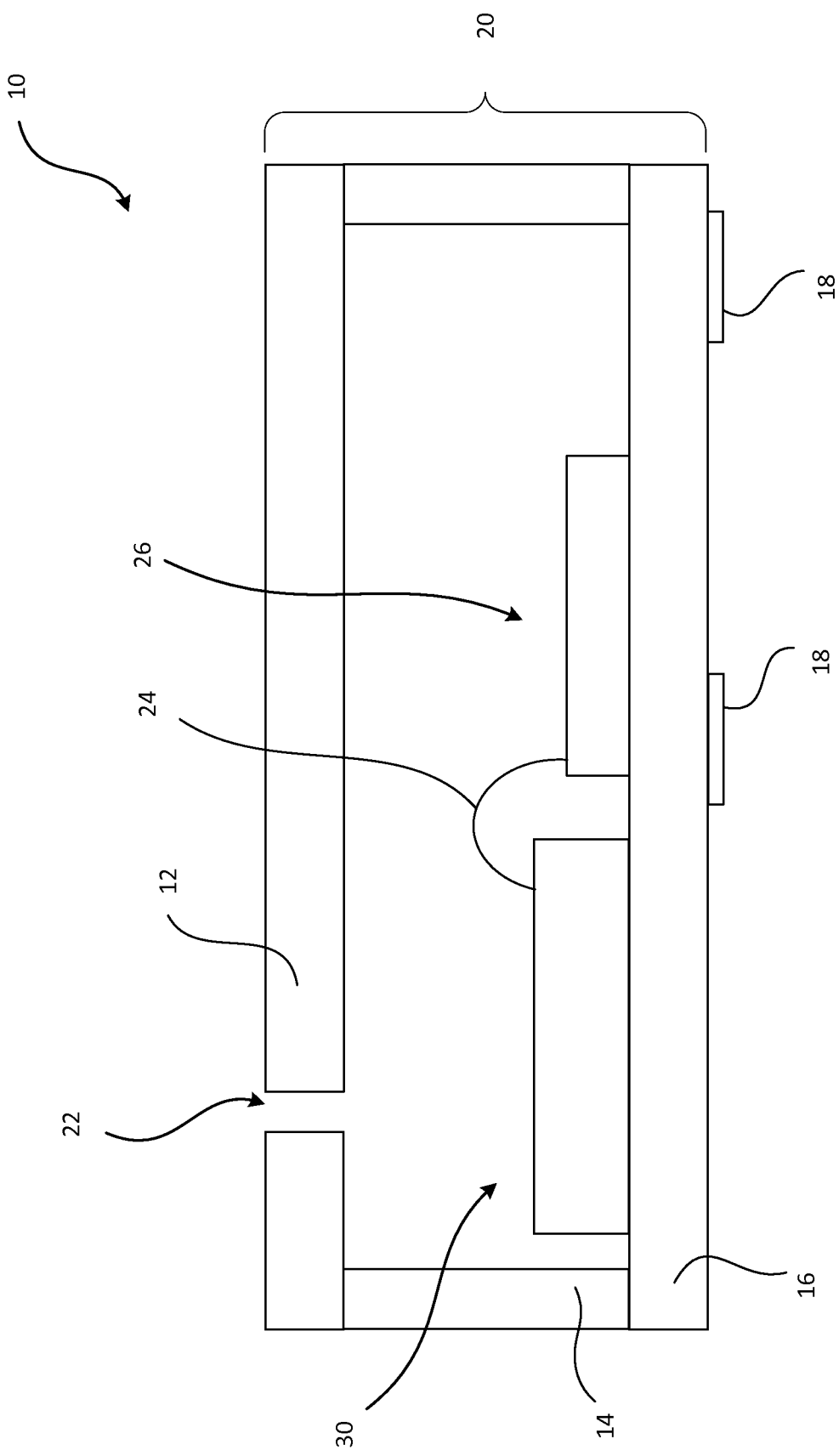
FIG. 2A is a cross-sectional view of the MEMS transducer system in the package of FIG. 1 in accordance with a described embodiment of the disclosure.
Figure 2B:
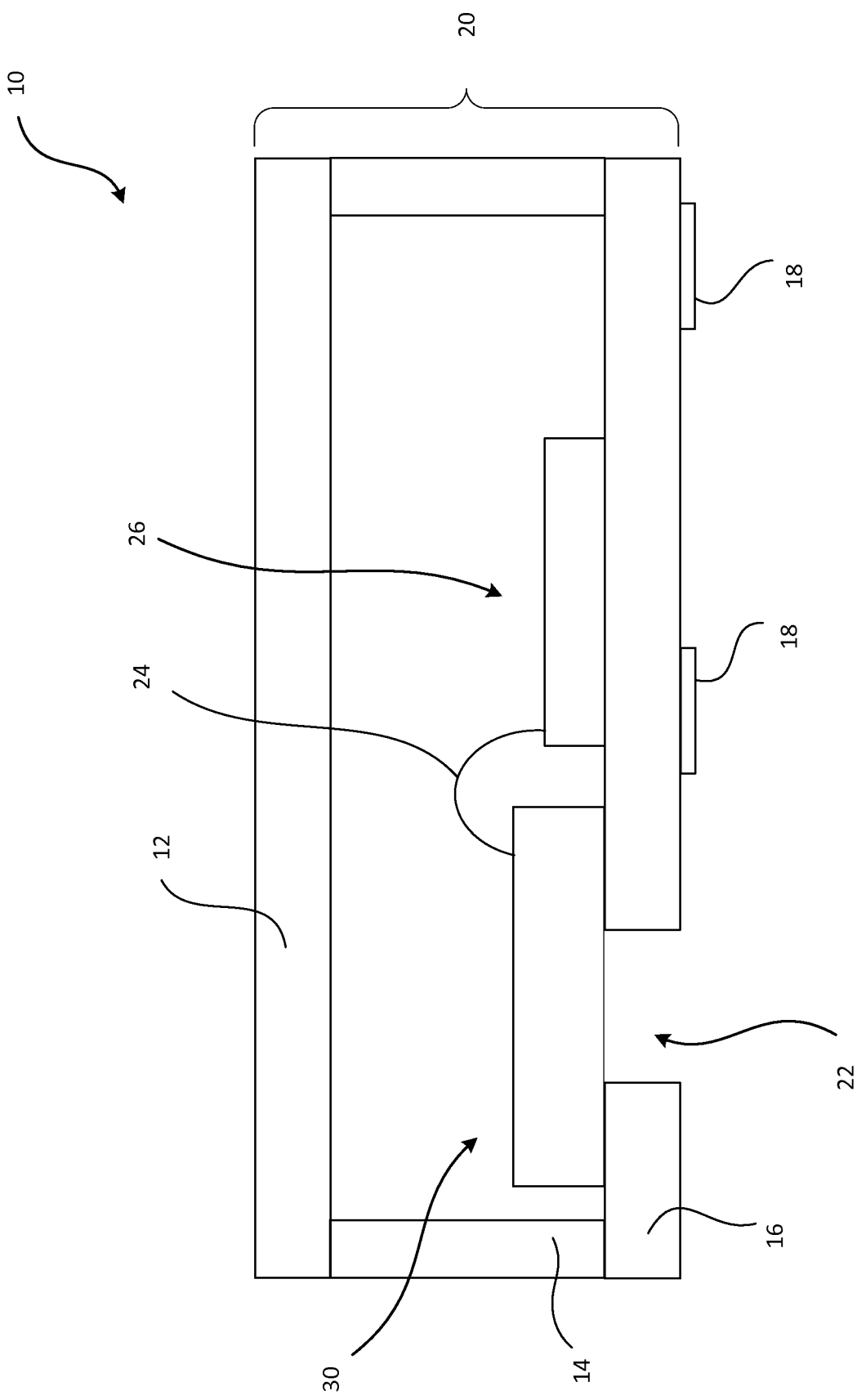
FIG. 2B is a cross-sectional view of another MEMS transducer system in the package of FIG. 1 with a bottom port in accordance with a described embodiment of the disclosure.
Figure 2C:
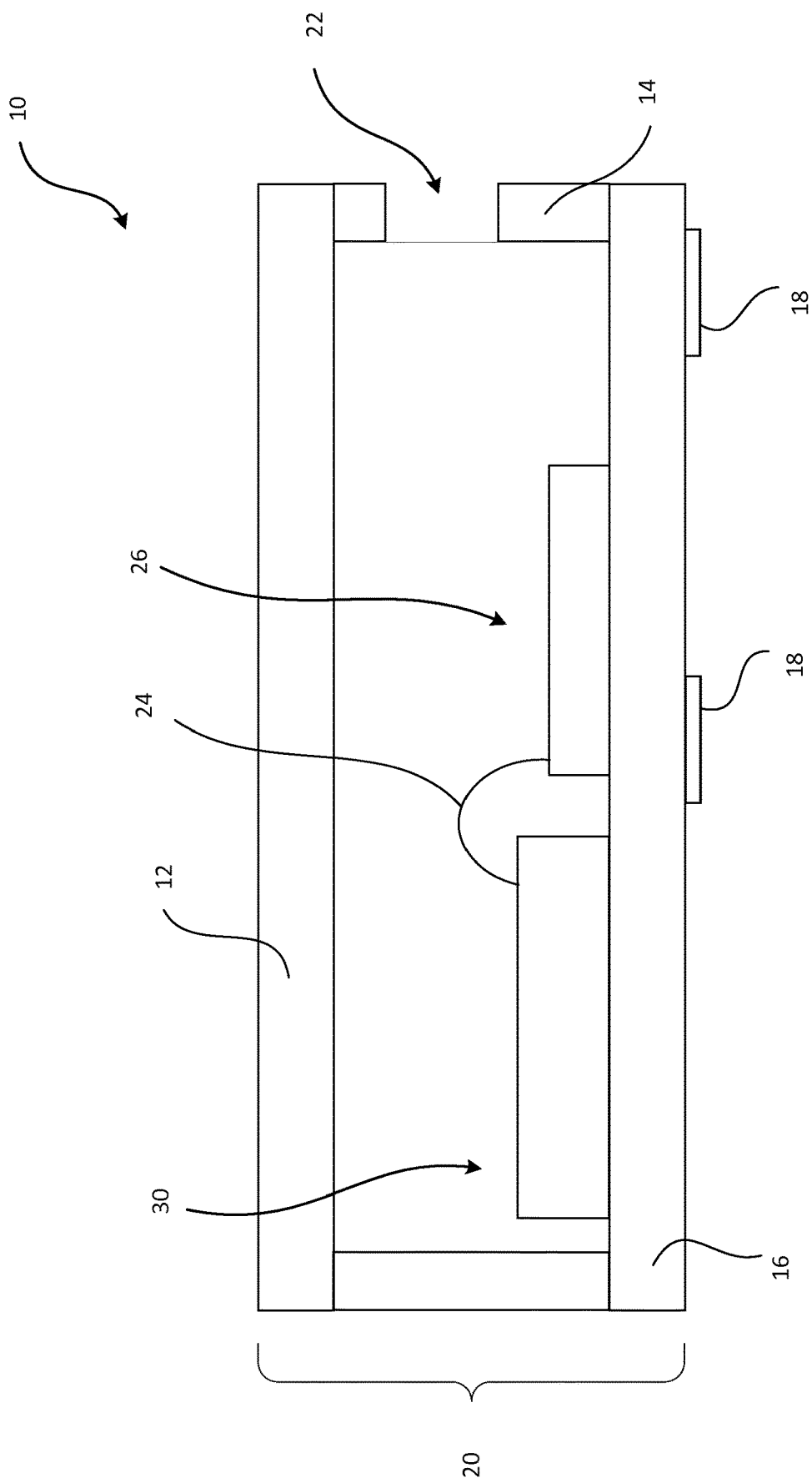
FIG. 2C is a cross-sectional view of another MEMS transducer system in the package of FIG. 1 with a side port in accordance with a described embodiment of the disclosure.

FIGS. 2A-2C illustrate cross-sectional view of the MEMS transducer systems 10 of FIG. 1 having at least one opening 22 formed on various location of the packaging housing 20 in accordance with a described embodiment of the disclosure. The MEMS transducer system 10 includes a sensor device/die 30 and a component 26 mounted within any location of the package housing 20. An opening 22 formed on any location of the package housing 20 is adjacent to at least one of the sensor device 30 or the component 26 is provided to receive attributes or stimuli from external environment. A connection link 24 may be introduced to communicatively couple the sensor device 30 to the component 26. The connection link 24 may be wire bonding, solder-bump, solder microbump, solder ball, or any suitable connectors. In some embodiments, the connection link 24 may be a wireless communication link and the sensor device 30 is communicatively coupled to the component 26 with built-in interfaces formed in both sensor device 30 and the component 26. The wireless communicative link, for example, may be WiFi, near field communication (NFC), Zigbee, Smart WiFi, Bluetooth (BT) Qi wireless communication, ultra-wide band (UWB), cellular protocol frequency, radio frequency, or any suitable communication link. Depending on the applications, any number of sensor devices 30, components 26, or connection links 24 between the sensor devices and the components may be used. Although side-by-side configuration of the component 26 and the sensor device 30 is illustrated in FIG. 1, any suitable configurations may be possible. For example, the sensor device 30 may be placed or mounted on top of the component 26 to form a stacked configuration. In another example, the sensor device 30 may be mounted in a hole formed within the component 26 configured to receive the sensor device to form a surrounded configuration.

FIG. 3A-3D illustrate a cross-sectional view of various embodiments of MEMS transducer devices 130, 130', 130", 130''' mounted within the MEMS transducer system 10 of FIG. 1 in accordance with an exemplary embodiment of the disclosure. As shown in FIG. 3A, the MEMS transducer device 130 includes first diaphragm element 38, second diaphragm element 40 spaced apart from the first diaphragm element 38, and a spacer 48 connects the first diaphragm element 38 to the second diaphragm element 40. Extended from the circumference portion of the spacer 48 and radially outwardly is a plate capacitor element, two plate capacitor elements 42a, 42b are illustrated. In one embodiment, the diaphragm elements 38, 40, the spacer 48, and the plate capacitor elements 42a, 42b may form as an integral structure of the same material. In another embodiment, the spacer 48 and the plate capacitor elements 42a, 42b may be integrally formed. Both ends of the spacer 48 are then attached to the diaphragm elements 38, 40 by any suitable attachment methods. In yet another embodiment, the spacer 48 and the diaphragm elements 38, 40 may be integrally formed and the plate capacitor elements 42a, 42b formed as two sub-plate capacitor elements, as illustrated, are attached to either body portion or outer-surface of the spacer 48 by any suitable attachment methods. In further another embodiment, a first spacer and the first diaphragm element 38 may form an integral structure. Similarly, a second spacer and the second diaphragm element 40 may form an integral structure. End portion of the first spacer is attached to a first surface of the plate capacitor element 42a or 42b. Likewise, end portion of the second spacer is attached to a second surface of the plate capacitor element 42a or 42b. In some embodiments, two plate capacitor elements 42a, 42b may be separately provided and each plate capacitor element includes a spacer integrally formed therein. End portions of the spacers opposed to the plate capacitor elements may be attached to first and second diaphragm elements 38, 40 after the two plate capacitor elements are attached or laminated to form a single plate capacitor element 42. A structure 43 may be formed around circumferential portions of the diaphragm elements 38, 40. The structure 43 may be formed from materials including an insulating material, non-insulating material, combination of alternating insulating and non-insulating materials, conductive material, non-conductive material, combination of alternating conductive and non-conductive materials. An optional vias 72 may be formed within the insulator structure 43. In one embodiment, optional diaphragm isolations may be attached to the diaphragm elements 38, 40.

First and second electrode elements 44, 46 may be provided between at least one of the diaphragm elements 38, 40 or the plate capacitor elements 42a, 42b. As illustrated in FIG. 3A, the first electrode element 44 located below the plate capacitor element 42a is attached to at least a portion of the insulator structure 43 by any suitable method of attachments. Similarly, the second electrode element 46 located above the plate capacitor element 42b is attached to at least a portion of the insulator structure 43 by any suitable method of attachments. In one embodiment, the first electrode element 44 offset from the second electrode element 46. In another embodiment, the electrode elements 44, 46 are parallel to each other on the same plane, as depicted in FIG. 3B.

Now referring to FIG. 3B, the MEMS transducer device 130' is similar to the MEMS transducer device 130 illustrated in FIG. 3A except the MEMS transducer device 130' includes first electrode element structure 144 and second element structure 146 below the first electrode element structure 144. Each electrode element structures 144, 146 include an opening 88 formed there between to receive the spacer 48. Like the electrode elements 44, 46, end portions of the electrode element structures 144, 146 are attached to a portion of the insulator structure 43 by any suitable attachment.

Now referring to FIG. 3C, the MEMS transducer device 130" is similar to the MEMS transducer device 130' of FIG. 3B except the MEMS transducer device 130" include a member 91 formed within the spacer 48 and separates the spacer 48 into top and bottom portions. The member 91 may be formed from materials including an insulating material, combination of alternating insulating and non-insulating materials, non-conductive material, combination of alternating conductive and non-conductive materials.

Now referring to FIG. 3D, the MEMS transducer device 130''' is similar to the MEMS transducer device 130 of FIG. 3C except that the MEMS transducer device 130''' includes oxides 93 buried in the plate capacitor elements 42a, 42b made from any suitable materials such as poly-silicon. Forming plate capacitor elements 42a, 42b with oxides 93 buried therein not only reduces the curvature of the plate capacitor elements 42a, 42b due to stress gradient, the oxides 93 buried in the plate capacitor elements 42a, 42b is counterbalanced. Any types of material suitable for inducing a controlled stress contribution or gradient may be used. For example, the material may be nitride, $Al_2O_3$, SiC, and any suitable materials. Depending on the curvature direction, the location where the oxides 93 is buried can be offset towards upper or lower surface of the plate capacitor elements 42a, 42b. In some embodiments, the thickness of the oxides can be turned to reduce the curvature.

As sound pressure impinges on the second diaphragm element 40 of FIGS. 3A-3D, the second diaphragm element 40 oscillates or deforms in response to the sound pressure. This oscillation movement of the second diaphragm element 40 which in turn causes the spacer 48 having one end coupled to the second diaphragm element 40 to oscillate in the same direction. The spacer 48 having a second end coupled to the first diaphragm element 38 also oscillates in the same direction as the second diaphragm element 40. The oscillation motion of the diaphragm elements 38, 40 translates to plate capacitor elements 42a, 42b through the spacer 48. When the diaphragm 40 moves upward, Gap G2 between the electrode element 46 or 146 and the plate capacitor element 42b becomes smaller, whereas Gap G1 between the electrode element 44 or 144 and the plate capacitor element 42a becomes larger or greater than G1. Therefore, the capacitance at G2 increases and the differential signal becomes larger whist G1 decreases. Such configuration of mechanically differential transducer not only reduces the overall parasitic capacitance of the MEMS transducer device 130, 130', 130", 130''' but as well increases dynamic range sensitivity and linearity of the MEMS transducer device 130, 130', 130", 130'''.

Figure 4C:
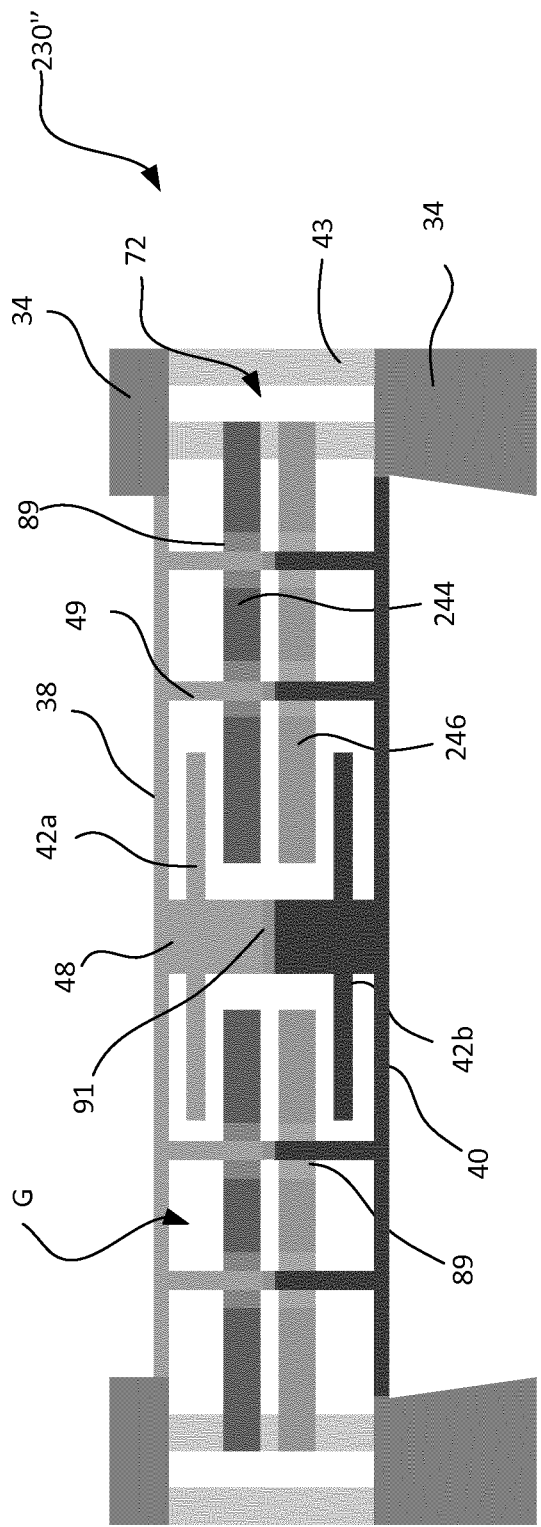
FIG. 4C is a cross-sectional view of a MEMS transducer device in accordance with another exemplary embodiment of the disclosure.

FIGS. 4A-4C illustrate various embodiments of MEMS transducer devices 230, 230', 230" of the disclosure. The MEMS transducer devices 230, 230', 230" are similar to the MEMS transducer devices 130, 130', 130" illustrated in FIGS. 3A-3C except the enclosed gap G between the diaphragms 38, 40 of the MEMS transducer devices 230, 230', 230" is evacuated. To stabilize the diaphragms 38, 40 mechanically, more than one post 49 is formed. As can be seen, end portions of each post 49 are attached to the diaphragm 38, 40 by any suitable method of attachment. Each of the post 49 are substantially spaced apart. Although the post 49 is shown in the form of a tubular shape, other geometry, configuration, size, or combination therefore, depending on the application, may be used without limiting the scope of the disclosure. In one embodiment, the post adjacent to the spacer 48 is thinner compared to the post adjacent to the insulator structure 43. Furthermore, the elasticity of the post may vary, depending of the application. Vias or openings 89 are formed within the electrode elements 44, 46, 244, 246 to receive the posts 49. Openings or through holes 89 are formed within the electrode elements 44, 46, 244, 246 by any suitable methods to receive the posts 49. The number of through holes 89 is substantially equal to the same number of posts 49.

FIGS. 5A and 5B illustrate various embodiments of MEMS transducer devices 330, 330' of the disclosure. The MEMS transducer devices 330, 330' are similar to the MEMS transducer device 230, 230' illustrated in FIGS. 4A-4B except the MEMS transducer devices 330, 330' include a thin film or a coating 74 applied or deposited on the outer surface of the diaphragms 38, 40. The film or the coating 74 defines as a barrier enhances chemical stability and liquid resistance, such as water. Although, the barrier 74 is formed on the outer surface of the diaphragms 38, 40, the barrier 74 may cover the entire diaphragms 38, 40 without departing from the teaching of the disclosure. In some embodiments, the diaphragms 38, 40 is formed from materials that includes a hydrophobic material, an insulating materials, or conductive materials with a barrier. Thus barrier is no longer required. In another embodiment, a material suffers from process induce compressive stress is used to form the diaphragms 38, 40, a tuning material having tensile stress may be deposited or applied to reduce the deficiency. The electrodes 44 and 46 are attached to isolating portion 343 to further reduce parasitic capacitance.

Figure 6A:
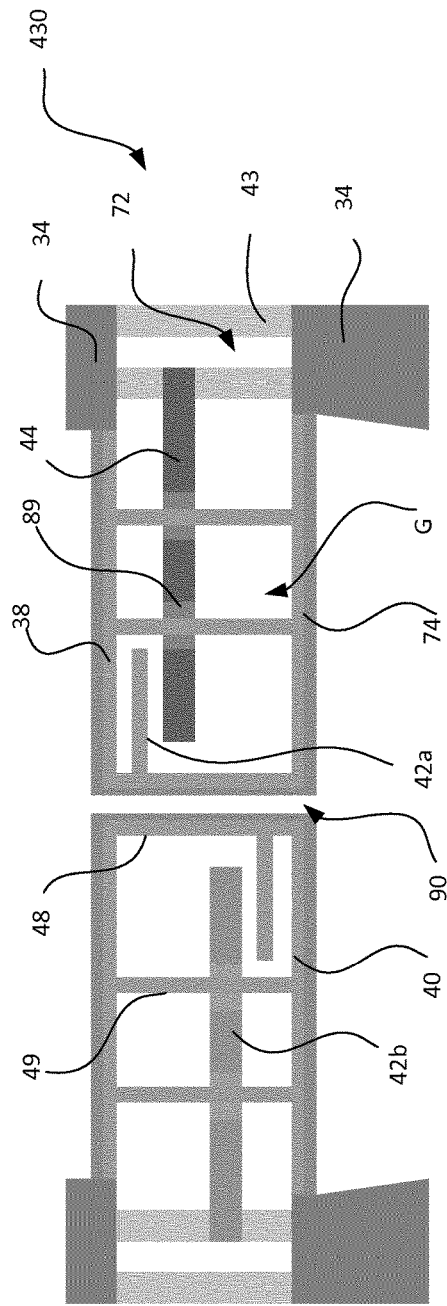
FIG. 6A is a cross-sectional view of a MEMS transducer device in accordance with another exemplary embodiment of the disclosure.
Figure 6B:
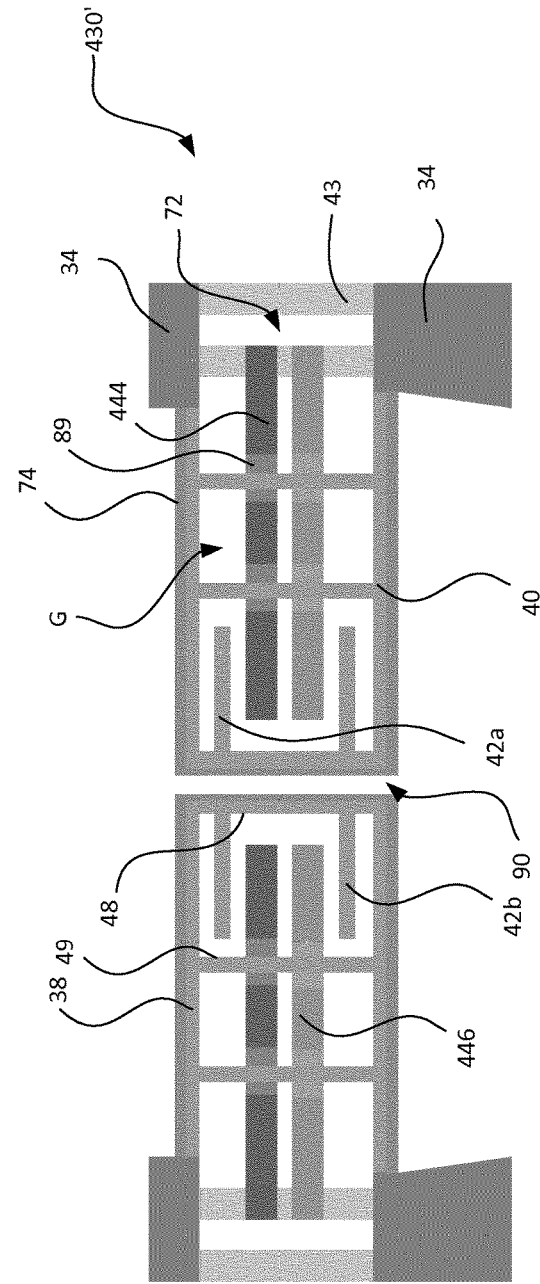
FIG. 6B is a cross-sectional view of a MEMS transducer device in accordance with another exemplary embodiment of the disclosure.
Figure 6C:
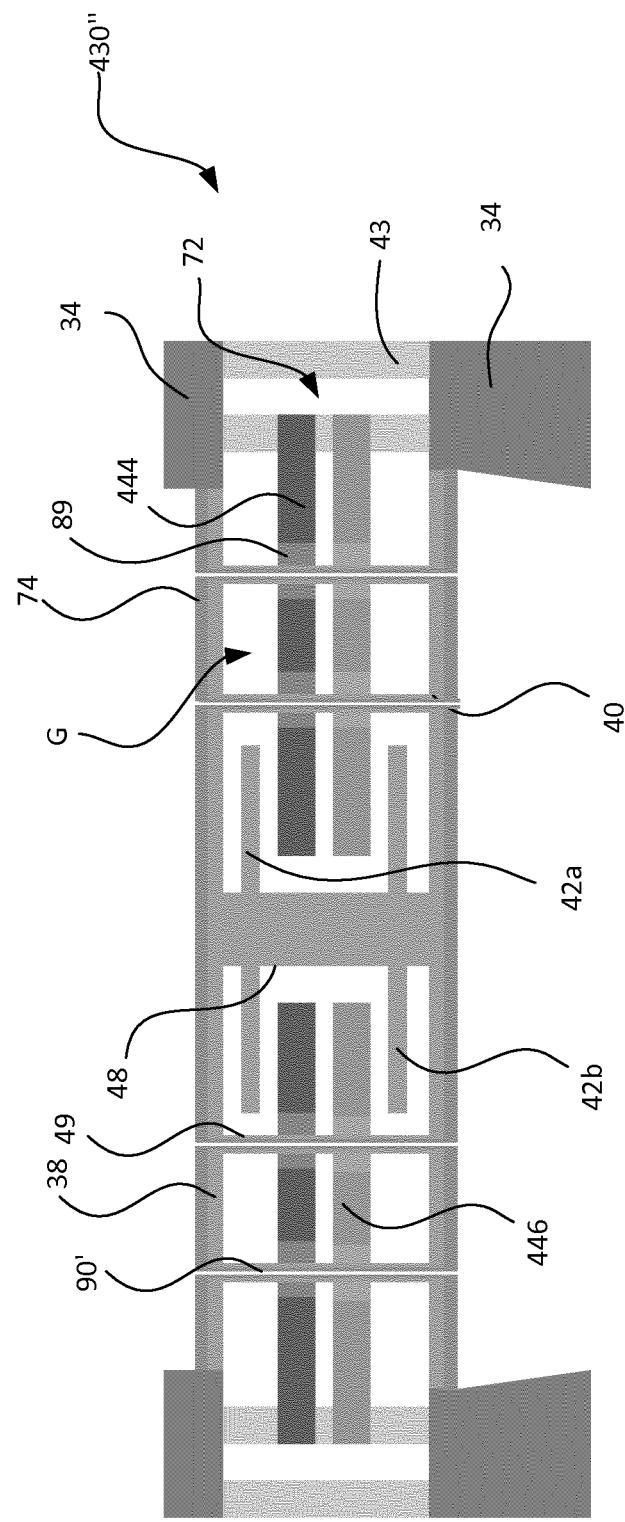
FIG. 6C is a cross-sectional view of a MEMS transducer device in accordance with another exemplary embodiment of the disclosure.

FIGS. 6A-6C illustrate another various embodiments of MEMS transducer devices 430, 430' of the disclosure. The MEMS transducer devices 430, 430' are similar to the MEMS transducer devices 330, 330' illustrated in FIGS. 6A and 6B except the MEMS transducer devices 430, 430' includes a leak hole or an opening 90 formed within the spacer 48 and continued to formed into both diaphragms 38, 40 until the leak hole is exposed. A barrier 74 is applied to the surfaces of the diaphragms 38, 40 and the surface of the leak hole 90. In some embodiments, as depicted in FIG. 6C, one or more leak holes 90' may be formed in the posts 49 by any suitable methods. The leak holes 90' continue into both diaphragms 38, 40 until the leak holes are exposed. The barrier 74 may optionally cover inner surface of the of the leak holes 90', in one embodiment, depending on the application. Although not shown, similar leak holes 90' may be formed in the MEMS transducer device 430 of FIG. 6A.

Figure 7A:
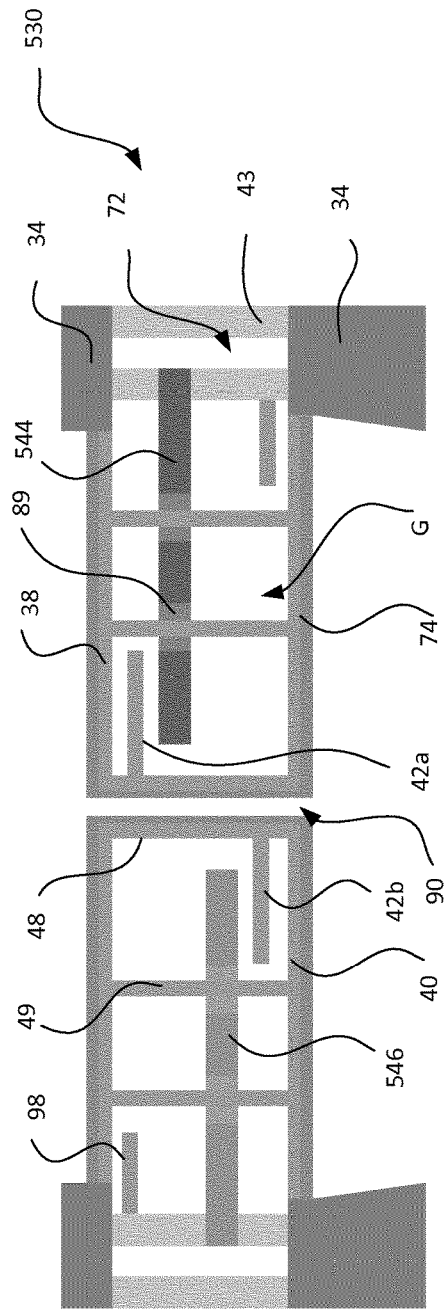
FIG. 7A is a cross-sectional view of a MEMS transducer device in accordance with another exemplary embodiment of the disclosure.
Figure 7B:
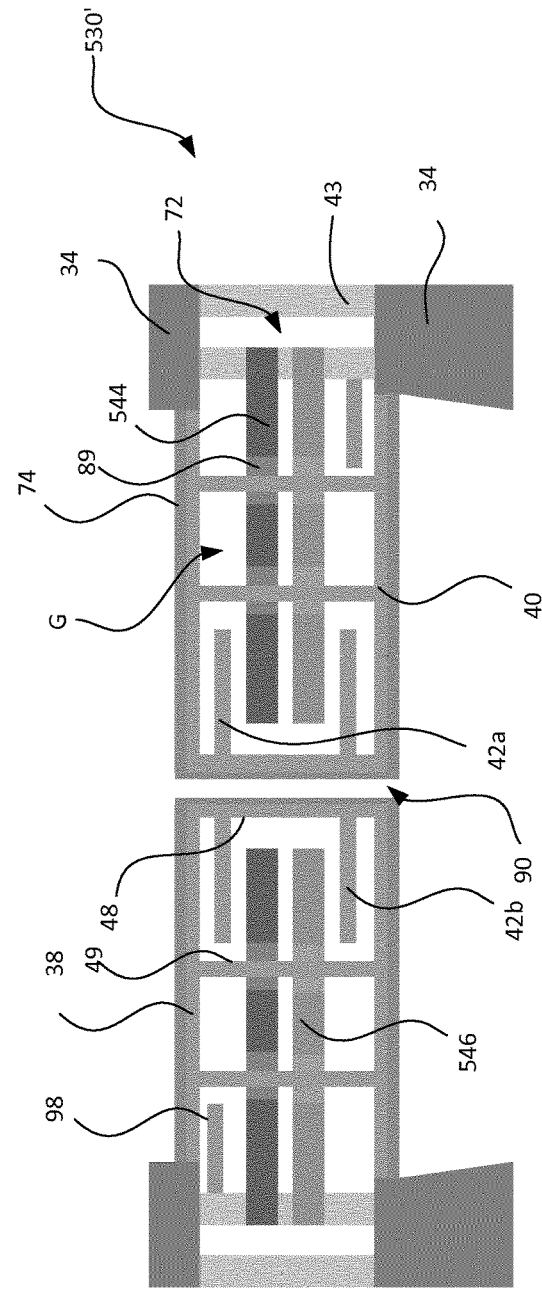
FIG. 7B is a cross-sectional view of a MEMS transducer device in accordance with another exemplary embodiment of the disclosure.

FIGS. 7A and 7B illustrate another various embodiments of MEMS transducer devices 530, 530' of the disclosure. The MEMS transducer devices 530, 530' is similar to the MEMS transducer devices 430, 430' illustrated in FIGS. 6A and 6B except a pressure sensing electrode 98 coupled to the insulator element 43 is formed within the gap G for sensing at least one of pressure signal or acoustic signal. As can be seen, the pressure sensing electrode 98 is located at a location proximal to at least one of the diaphragm 38 or the diaphragm 40 by any attachment methods. Pressure sensing region may be formed in a different location other than the region illustrated in FIGS. 7A and 7B. When the ambient changes with respect to the enclosed pressure, the portion of the membrane above the pressure sensing electrode 98 deforms and the gap changes is sensed capacitively. The pressure sensing electrode 98 can be formed on any previously described MEMS transducer devices 30, 130, 130', 130", 130'", 230, 230', 230", 330, 330' for sensing at least one of pressure signal or acoustic signal without departing the teaching of the disclosure.

Figure 8:
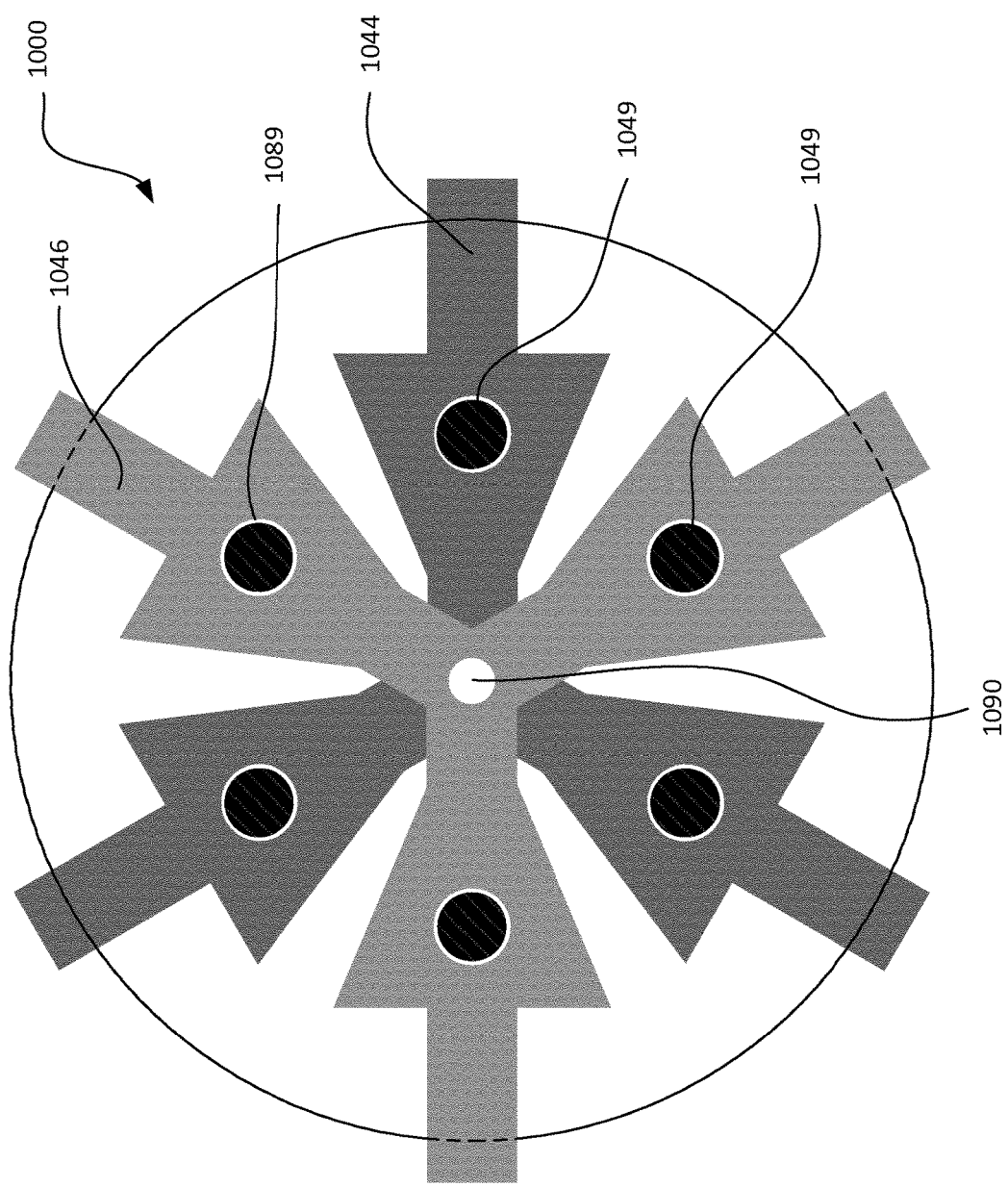
FIG. 8 is a top view of an electrode element structure in accordance with an exemplary embodiment of the disclosure.

FIG. 8 illustrates a top view of an exemplary embodiment of electrode element structure 1000 of the disclosure. The electrode element structure 1000 includes electrode elements 1044, 1046 positioned on top of each other and spaced apart by any suitable gap in order to reduce parasitic capacitance. Although the electrode element 1046 stacks on top of the electrode element 1044, the order can be reverse without departing from the teaching of the disclosure. Each electrode elements 1044, 1046 include one more vias or holes 1089 to receive a post 1049. A central leak hole 1090 is formed on the electrode element structure 1000 to optionally receive a barrier. It is understood that any configuration, geometry, size, and shape may be considered to form the electrode element structure 1000, depending on the application, without departing from the teaching of the disclosure.

Figure 9:
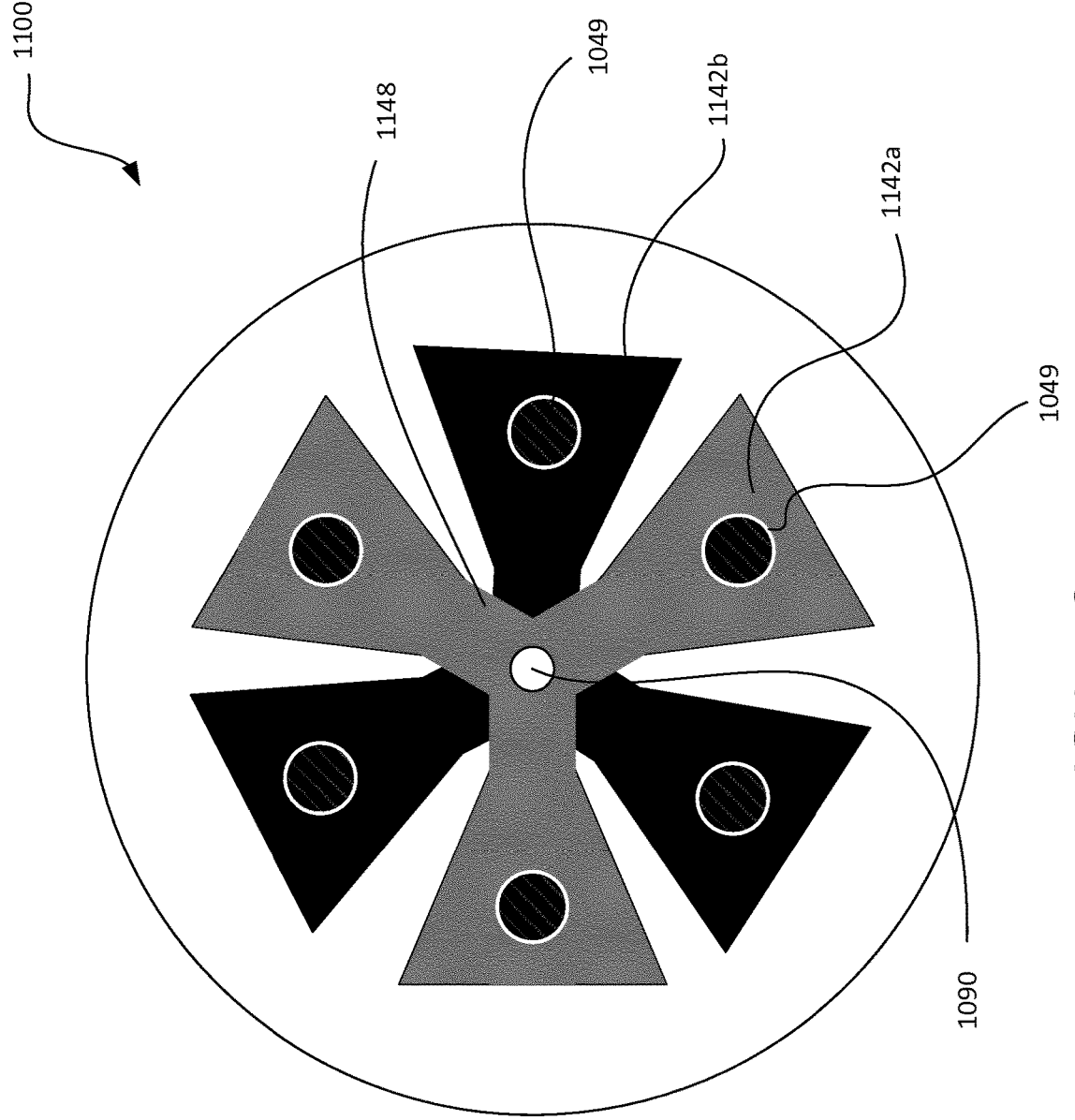
FIG. 9 is a top view of a counter electrode structure in accordance with an exemplary embodiment of the disclosure.

FIG. 9 illustrates a top view of an exemplary embodiment of plate capacitor structure 1100 of the disclosure. The plate capacitor structure 1100 includes plate capacitor elements 1142a, 1142b positioned on top of each other and spaced apart by any suitable gap distance. The plate capacitor elements 1142a, 1142b can be understood as the plate capacitor elements 42a, 42b as of preceding figures. Although the plate capacitor element 1142a is stacked on top of the plate capacitor element 1142b, the order can be reversed without departing from the teaching of the disclosure. Each plate capacitor elements 1142a, 1142b include optional vias or through holes for receiving posts. A central leak hole 1090 is formed on the plate capacitor structure 1100 to optionally receive a barrier. It is understood that any configuration, geometry, size, and shape may be considered to form the plate capacitor structure 1100, depending on the application, without departing from the teaching of the disclosure.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the sprit and scope of this disclosure.

While the patent has been described with reference to various embodiments, it will be understood that these embodiments are illustrative and that the scope of the disclosure is not limited to them. Many variations, modifications, additions, and improvements are possible. More generally, embodiments in accordance with the patent have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A MEMS sensing transducer system comprising:
   a first diaphragm and a second diaphragm spaced from the first diaphragm, defining a gap therebetween;

a perimeter wall structure extending between the first diaphragm to the second diaphragm, the perimeter wall structure enclosing the gap;

a pressure sensing electrode formed within the gap;

a spacer extending between and attached to the first diaphragm and the second diaphragm in the gap, the spacer being arranged in a central region between the first diaphragm and the second diaphragm and spaced apart from the perimeter wall structure; and a plate capacitor including two plate capacitor electrodes formed within the gap, the two plate capacitor electrodes each attached to and extending radially outwardly from the spacer, wherein the pressure sensing electrode is located adjacent to at least one of the first or the second diaphragm.

2. The MEMS sensing transducer system of claim 1 wherein the spacer includes a through hole.

3. The MEMS sensing transducer system of claim 2 further comprising:

top and bottom substrates; and a wall structure extending between the top and bottom substrates;

wherein the pressure sensing electrode is located adjacent to at least one of the first or the second diaphragm and is attached to the wall structure.

4. The MEMS sensing transducer system of claim 3 further comprising one or more posts formed within the gap extending between and connected to the first diaphragm and the second diaphragm.

5. The MEMS sensing transducer system of claim 4 wherein each of the first and second diaphragm includes an outer surface, and wherein a barrier is applied to the outer surfaces of the first and second diaphragms.

6. The MEMS sensing transducer system of claim 1 further comprising at least one electrode structure formed between the pressure sensing electrode and one of the plate capacitor electrodes.

7. The MEMS sensing transducer system of claim 6 wherein the electrode structure includes one or more openings through which the posts extend.

8. A transducer system for pressure and acoustic sensing comprising:

a top substrate and a bottom substrate;

a diaphragm assembly disposed on the bottom substrate, the diaphragm assembly having a first diaphragm, a second diaphragm, and a gap formed therebetween;

a spacer extending between the top substrate and the bottom substrate;

a perimeter wall structure extending between the top substrate and the bottom substrate and enclosing the gap;

a plate capacitor including two plate capacitor electrodes formed within the gap; and a pressure sensing electrode formed within the gap;

wherein the pressure sensing electrode is located adjacent to at least one of the first and the second diaphragms, wherein the pressure sensing electrode is attached to the wall structure and extends outwardly from the wall structure, and wherein the two plate capacitor electrodes are each attached to and extend radially outwardly from the spacer.

9. The transducer system of claim 8 further comprising one or more posts formed within the gap, the one or more posts extending between and being connected to the first diaphragm and the second diaphragm.

10. The transducer system of claim 9 wherein at least one through hole is formed within at least one of the posts.

11. The transducer system of claim 8 further comprising a barrier formed on the diaphragm assembly.

* * * * *